United States Patent [19]
Okazaki

[11] Patent Number: 5,084,088
[45] Date of Patent: * Jan. 28, 1992

[54] HIGH TEMPERATURE ALLOYS SYNTHESIS BY ELECTRO-DISCHARGE COMPACTION

[75] Inventor: Kenji Okazaki, Lexington, Ky.

[73] Assignee: University of Kentucky Research Foundation, Lexington, Ky.

[*] Notice: The portion of the term of this patent subsequent to Dec. 4, 2007 has been disclaimed.

[21] Appl. No.: 594,739

[22] Filed: Oct. 9, 1990

Related U.S. Application Data

[63] Continuation of Ser. No. 368,569, Jun. 20, 1989, abandoned, which is a continuation-in-part of Ser. No. 158,570, Feb. 22, 1988, abandoned.

[51] Int. Cl.⁵ .............................................. H05B 3/60
[52] U.S. Cl. ...................... 75/10.1; 75/10.62
[58] Field of Search ............................. 75/10.1, 10.62; 148/11.5, 131; 373/120, 135

[56] References Cited

U.S. PATENT DOCUMENTS

| | | |
|---|---|---|
| 2,355,954 | 8/1944 | Cremer . |
| 3,213,491 | 12/1961 | Craig . |
| 3,529,457 | 9/1970 | Butler .............................. 148/11.5 |
| 3,605,245 | 9/1971 | Zapf ............................. 29/DIG. 31 |
| 4,337,373 | 6/1982 | Fletcher ............................. 75/10.65 |

OTHER PUBLICATIONS

"Resistance Sintering under Pressure" Lenel, Journal of Metals, 1955.

*Primary Examiner*—Peter D. Rosenberg
*Attorney, Agent, or Firm*—King & Schickli

[57] ABSTRACT

A method is provided for synthesizing high temperature alloys from elemental powders. The method includes the steps of placing the elemental powders to be processed in a die. A relatively high pressure is then applied to the powders. Substantially simultaneously, an electrical discharge is applied to the powders. The discharge is of relatively high voltage and current density to provide alloying. A product fabricated by the present method is also described and claimed.

7 Claims, 2 Drawing Sheets

HIGH TEMPERATURE ALLOYS SYNTHESIS BY ELECTRO-DISCHARGE COMPACTION

This is a continuation of application Ser. No. 07/368,569, filed June 20, 1989, now abandoned which is a continuation-in-part of pending U.S. patent application, Ser. No. 158,570, filed Feb. 22, 1988, now abandoned, and entitled "Method of Processing Superconducting Material and Its Products".

TECHNICAL FIELD

The present invention relates generally to the processing of powdered materials and, more particularly, to the synthesis of high temperature alloys utilizing electro-discharge compaction.

BACKGROUND OF THE INVENTION

New ultra high technology aircraft and launch vehicles are presently being designed and developed. An example of such an aircraft is the "Orient Express". It is anticipated that the Orient Express would be able to achieve speeds of approximately Mach 8 and be able to fly from New York to Tokyo in approximately 3 hours. The feasibility of such an aircraft, however, depends on the development of new, strong, lightweight structural materials. Weight saving from the utilization of such materials directly translate into increases in payload as well as in fuel economy. In addition, engine materials must be developed that can withstand extremely high operating temperatures up to, for example, 3,200° F. Such high operating temperatures are preferred as they increase overall fuel efficiency.

Because of the unique requirements for the construction of such a sustained high speed aircraft, progress must be made in the development of new composites and advanced alloys from which turbine blades and other engine components may be constructed. At present, the most likely candidates for these advanced alloys may be found in the metal matrix composites with non-metallic elements or rare earth elements and intermetallic compounds of transition metals with aluminum such as titanium and tantalum aluminides.

Titanium alloys have historically been attractive for use in gas turbine engines because of their low density, high strength and good corrosion resistance. These properties have permitted the substitution of titanium alloys for heavier, less effective materials. In many cases, titanium alloys have allowed engineers to not only increase the strength of aircraft but also reduce the overall weight as well as the number of parts required. As such, titanium alloys are responsible for significant advances made in the construction of aircraft in recent years. Additional advances are, however, still required for supersonic aircraft designs such as the Orient Express.

More recently, powder metallurgy and rapid solidification techniques have been utilized to develop improved alloys. These techniques have originally shown promise as they facilitate greater amounts of alloying additions as well as improved homogeneity in the resulting product. They have also suggested that higher temperature applications may be attainable.

The initial stages of processing require the desired alloy to be melted and cast into a proper ingot in a protective atmosphere. This ingot is then atomized in an inert atmosphere with a high cooling rate by irradiating electron or laser beams over the surface of the rapidly rotating ingot. The alloy powders thus produced are then vacuum canned and hot deformed to achieve approximately 100% density.

Unfortunately, a number of processing problems have largely prevented these techniques from being effectively utilized on any type of successful commercial scale. More specifically, alloys prepared in the manner described above experience a number of difficulties including chemical segregation and contamination of the alloy from the crucible material during melting. More specifically, even though the cooling rate is maintained high during atomization to avoid chemical segregation within individual powder particles, the atomization process does not guarantee the chemical homogeneity in the entire powder product. This, of course, is true since the electron or laser beams melt only the skin of a rapidly rotating ingot. Thus, the inhomogeneity of an ingot inherent in this slow solidification is passed on to the resulting alloy powders.

Additional processing problems are associated with the powder metallurgy consolidation of the alloy powders to bulk products. Because of the reactivity of the alloy powders, the powders have to be vacuum canned and mechanically processed at elevated temperatures by, for example, pressing, forging, rolling, swaging, extrusion or hipping. All of these processing procedures require the removal of can material prior to further machining into products. Of course, heatings during this consolidation process require a long period of time to homogenize the temperature of powders loosely packed. Unfortunately, this serves to alter the microstructure of the alloy powders with a resulting degradation in the alloy properties of the product.

A need is therefore identified for an improved method for synthesizing high temperature alloys that retain their unique mechanical properties.

SUMMARY OF THE INVENTION

Accordingly, it is a primary object of the present invention to provide a new method of processing and synthesizing high temperature alloys overcoming the above-described limitations and disadvantages of the prior art.

An additional object of the present invention is to provide a more efficient and economical method for processing high temperature alloys into compacts and monoliths near theoretical density.

Another object of the present invention is to provide an economical method for processing high temperature alloys at ambient temperatures without the need of a protective atmosphere.

Yet another object of the present invention is to provide a method of electro-discharge compaction for producing high temperature alloys of desired shapes with little or no grain growth. The resulting products of the processing, therefore, retain a fine grain structure and provide greatly enhanced mechanical properties.

Additional objects, advantages and other novel features of the invention will be set forth in part in the description which follows, and in part, will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, an improved method is provided for processing and synthesizing high temperature alloys of any arbitrarily desired composition from elemental powder and consolidating powder materials. The first step involves the placing of powders of a desired compositional mixture into a die. Next is the applying of a relatively high pressure of substantially 1.0 to 15.0 KSI to the powders in the die. Substantially simultaneously with the application of this pressure is the applying of an electrical discharge to the powders so as to generate sufficient heat for alloying. The electrical discharge has a relatively high voltage of substantially 5.0 to 30.0 kV and a relatively high current density of substantially 322.5 to 6450.0 kA/in$^2$.

Advantageously, through the substantially simultaneous application of this pressure and electrical discharge, the powders are rapidly alloyed together within a time period of approximately 10-200 $\mu$s. Further, the synthesis may be performed at ambient temperatures without a protective atmosphere. As such, processing is typically more economical than possible with processing techniques utilized in the past. In addition, it should be appreciated that the alloyed materials as produced also have sufficient mass so that heat is rapidly dissipated by self-quenching. Thus, chemical diffusion is limited and, therefore, the resulting new alloy has a more homogeneous structure and exhibits enhanced mechanical properties.

In accordance with a further aspect of the present invention, the method includes the step of tailoring the properties of the high temperature alloy by blending different powders together. For example, various elemental powders may be mixed together in a mixing lubricant such as acetone, prior to being placed in the die for processing to a density between approximately 80 and 95% of theoretical density. After placing the powders in the die a positive pressure is applied so as to compact the powders sufficiently to allow the effective measurement of the electrical resistance of the powders. The measured resistance is then compared to the resistance of the apparatus circuit. After confirming that the resistance is higher for the powders than the circuit, the processing of a high temperature alloy monolith is continued.

In accordance with an additional aspect of the present invention, a dense monolith of high temperature alloy, as fabricated in accordance with the method set forth above, is provided. More specifically, by utilizing the present method, the monolith may be constructed in either simple or relatively complex shapes as desired for any particular application. In addition, the monolith includes a homogeneous and relatively fine grain structure. As a result, the monolith is characterized by significantly enhanced mechanical properties throughout its cross-section.

Still other objects of the present invention will become apparent to those skilled in this art from the following description wherein there is shown and described a preferred embodiment of this invention, simply by way of illustration of one of the modes best suited to carry out the invention. As it will be realized, the invention is capable of other different embodiments and its several detrails are capable of modification in various, obvious aspects all without departing from the invention. Accordingly, the drawings and descriptions will be regarded as illustrative in nature and not as restrictive.

BRIEF DESCRIPTION OF THE DRAWING

The accompanying drawing incorporated in and forming a part of this specification, illustrates several aspects of the present invention, and together with the description serves to explain the principles of the invention. In the drawing.

Figure 1:
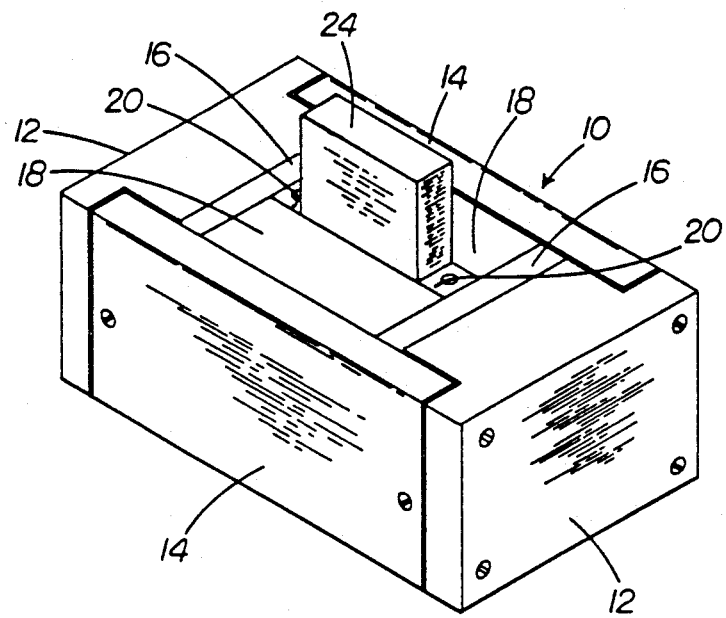
FIG. 1 is a perspective view of a die that may be utilized with the method of the present invention.

Reference will now be made in detail to the present preferred embodiment of the invention, an example of which is illustrated in the accompanying drawing.

DETAILED DESCRIPTION OF THE INVENTION

Reference is now made to the drawing FIGURES which serve to help explain the method of the present invention. This versatile method allows the fabrication of relatively dense monoliths from any arbitrarily desired composition of elemental powders or elemental and consolidating powders. In addition, it should be appreciated that the monoliths may be formed in either relatively simple or complex shapes as desired for any particular application.

Figure 2:
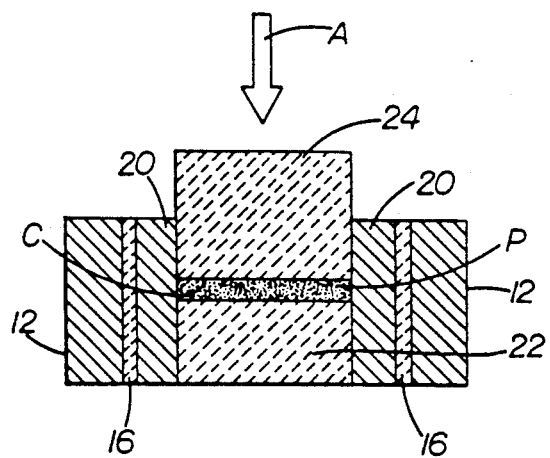
FIGS. 2 and 3 are cross-sectional views of the die shown in FIG. 1.
Figure 3:
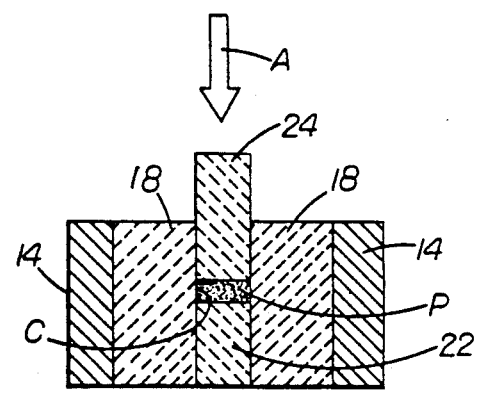

When making a monolith from a mixture of elemental powders, the elemental powders are selected so as to specifically tailor the desired physical characteristics and mechanical properties of the monolith. Where desired or necessary, the elemental powders may be further mixed with consolidating powders in the desired proportions in a mixing lubricant such as acetone. The mixed elemental powders are then placed or deposited directly into an insulated die 10 (see FIGS. 1-3) designed to compact the powders into any particular shape. As shown for purposes of explanation, the die 10 is designed to form the elemental powders into a simple bar shape.

The die 10 includes an outer tool steel confinement of high strength in order to withstand the processing pressures. The confinement is formed by opposing tool steel end walls 12 and opposing tool steel side walls 14 that are securely fixed together.

An insulating mica insert 16 is provided across the inner face of each end wall 12. An insulating ceramic side block 18 extends between each mica insert 16 adjacent and in contact with each side wall 14. Of course, the tool steel side walls 14 serve to support the ceramic side blocks 18 during processing.

An electrode 20 is positioned at each end of the space between the side blocks 18 adjacent and against the mica inserts 16. A ceramic punch 22 is provided between the electrodes 20 and the ceramic side blocks 18. The punch 22 engages the inner walls of the electrodes 20 and the side blocks 18 so as to close the bottom of the die 10. Together, the ceramic side blocks 18, electrodes 20 and ceramic punch 22 define a die cavity C into which the elemental powders are placed for processing.

Figure 5:
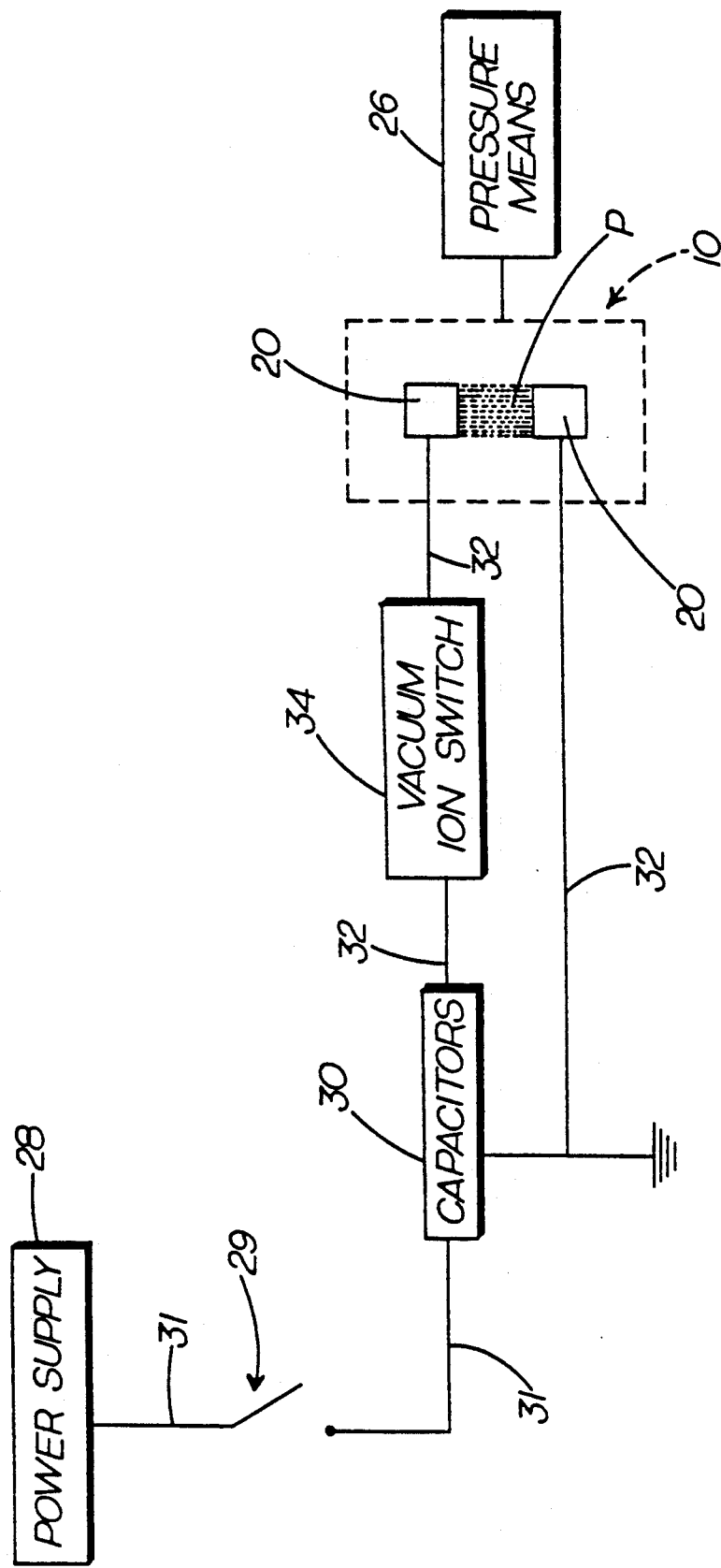
FIG. 5 is a schematic diagram of the circuit of an apparatus designed to perform the method of the present invention.

After placing the elemental powders P into the die 10, the die is vibrated to settle the powders. An upper punch 24 is then inserted between the electrodes 20 and ceramic side blocks 18 so as to close the top of the die cavity C. A positive pressure of approximately 4,000 psi is then applied by hydraulic press or some other means 26 (see FIG. 5) to the upper punch 24 (note also action arrow A in FIGS. 2 and 3) while the lower punch 22 is firmly maintained in position. This pressure serves to compact the powders P sufficiently to allow the effective measurement of the electrical resistance of the powders undergoing processing in the die 10.

The measured resistance of the powders P is compared to the resistance of the apparatus circuit (see FIG. 5) including the power supply 28, capacitors 30 and connecting lead lines 31 and 32. The resistance of the powders P being processed must be higher than the resistance of the apparatus circuit. Otherwise, the current applied during processing is just passed through the powders P and electrode discharge compaction does not take place. Conversely, the resistance of the powders P must not be too high or an explosion may occur during processing. For purposes of example, for an apparatus circuit having a resistance of approximately 7 milliohms, the material being processed should have a resistance of between approximately 10 and 560 milliohms.

After verifying the proper resistance, the mechanical switch 29 is closed and the capacitors 30 are charged utilizing the power supply 28. Of course, any size capacitor or bank of capacitors 30 providing sufficient electrical energy storage for processing may be utilized. In this regard, a capacitor or multi-capacitor bank providing from approximately 240–720 $\mu$F is desired.

Once the capacitors 30 are charged, the powders P and the die 10 are ready for processing. The press 26 is activated to apply a pressure to the powders P in the die 10 to approximately 1.0–15.0 ksi. Substantially simultaneously, a vacuum ion switch 34 is closed and the stored electrical energy in the capacitors 30 is discharged rapidly through the switch 34 and applied through the lead lines 32 and the electrodes 20 to the powders P. In fact, the necessary application of electrical discharge to complete bonding and compaction is of a duration of substantially 10–200 $\mu$s.

More specifically, the electrical discharge is applied with a relatively high voltage of 5.0–30.0 kV and a relatively high current density of 322.5–6450.0 kA/in$^2$ and, more preferably, between 322.5–3225.0 kA/in$^2$. Probes (not shown) may, of course, be provided to monitor these parameters. Together, the simultaneous application of the pressure and electrical discharge allows the elemental powders P to be compacted to between approximately 80–95% of theoretical density while also maintaining unique mechanical properties.

Figure 4:
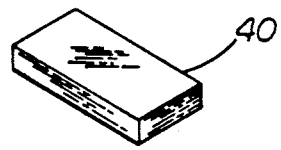
FIG. 4 is a perspective view of the compacted monolith produced by the method of the present invention.

Due to the extremely short processing time and the nature of the powders P being processed, the temperature of the powders only rises on application of the electrical discharge along the powder particle interfaces. Any oxide coating on the particle surfaces acts as a semiconductor. With the charge concentrated on the surface of the particles, substantially instantaneous heating to a temperature higher than 1,000° C. takes place and the oxide coating expands and essentially explodes from the particle surfaces. Thus, pure elemented powder is fully exposed for sharp bonding. In addition, the rapid passage of heat into the surrounding mass of the monolith provides a self quenching that serves to maintain the temperature level throughout the remainder of the powders sufficiently low so as to avoid any significant atomic diffusion. As further appreciated, because of the instantaneous nature of the heating and quenching, the processing may be completed without utilizing and providing any type of protective atmosphere. Further, grain growth is minimized so that mechanical properties can be greatly enhanced. Thus, the resulting high temperature alloy monolith retains a fine grain structure with substantially homogeneous chemistry. A monolith, in the shape of a bar 40, fabricated in accordance with the method of the present invention described above is shown in FIG. 4.

The following examples are presented to further illustrate the invention, but it should be recognized that the invention is not to be considered as limited thereto.

EXAMPLE 1

7 and 10 wt % of boron carbide (B$_4$C) powders (average particle size of 3.4 $\mu$m) are thoroughly mixed with titanium (Ti) powders (average particle size of 45 $\mu$m) to make up 5 grams in total with acetone as the mixing lubricant. The slurry powder mixture is put in a die as described above having dimensions of 1 inch in length and ¼ inch in width. An external pressure of approximately 4,000–15,000 pounds was applied over 1 square inch (2×½ in ) to produce a specimen resistance of 280 to 560 milliohms. An electro-discharge was made by closing the circuit to discharge the electrical energy from three capacitors of 240 $\mu$F each connected in parallel (discharging time is in the order of 180 $\mu$s) through the powders in the die without the utilization of a protective atmosphere. The results are summarized in Table 1.

TABLE 1

| | Energy, reactivity, hardness and density of EDC specimens | | | | | |
|---|---|---|---|---|---|---|
| | 7 wt % B$_4$C | | | 10 wt % B$_4$C | | |
| Input energy | 6 kJ | 8 kJ | 10 kJ | 6 kJ | 8 kJ | 10 kJ |
| Reaction zone | none | ½ | entire | ½ | entire | entire |
| Hardness (kg/mm$^2$) | 100 | 1200 (700–1500) | 1400 (800–1560) | 800 (500–1450) | 1500 (800–1600) | 1500 (1200–1600) |
| Achieved density (g/cm$^3$) | 2.92 | 3.73 | 4.05 | 3.08 | 3.73 | 3.85 |
| % of theoretical | (68) | (87) | (95) | (74) | (90) | (95) |

Here, the theoretical density (%) is calculated under an assumption that the reaction occurs as

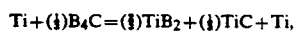
$$Ti+(\tfrac{1}{4})B_4C=(\tfrac{1}{4})TiB_2+(\tfrac{1}{4})TiC+Ti,$$

so that the reaction product is the mixture of Ti$_4$B and TiC dispersed in the Ti matrix. For calculating the theoretical density the simple mixture rule is employed.

The hardness results indicate that the microVickers hardness varies from 100 to 1600 H$_v$, compared to 4200 H$_v$ of B$_4$C and 100 H$_v$ of pure Ti. It can, therefore, be concluded that hardness of 800 to 1500 H$_v$ in the reaction zone is not due to just a mixture of Ti and B$_4$C (a mixture rule would give hardnesses of 450 and 550 $H_v$ for 7 wt % and 10 wt % $B_4C$ mixtures, respectively), but due to the hardness of reaction products dispersed in the Ti matrix. The transmission electron microscopic observations of an electro-discharge compaction specimen revealed that the disassociation of $B_4C$ has occured to form TiB, not $TiB_2$, as a new phase in the Ti matrix. No TiC phase was found. It is hypothesized that since the period of discharging is so short and cooling is very fast, not enough time is available for allowing the disassociated B and C to diffuse to form $TiB_2$ and TiC. Instead of $TiB_2$, TiB has been formed which is confirmed from the diffraction spots and X-ray diffraction peaks, and C is still in the interstitial positions. Also noteworthy is that $B_4C$ has been dissociated to form a new phase in the Ti matrix and there is no trace of $TiC_2$ at the prior particle boundaries. Therefore it can be concluded that electro-discharge compaction can synthesize new alloys from a mixture of elemental powders of Ti and $B_4C$ in air.

Although the detailed explanation here is given to a case of electro-discharge compaction synthesis of Ti alloys strengthened by TiB and C, this invention is not limited only to the aforementioned example. Other intermetallic compounds may, of course, be synthesized by electro-discharge compaction of the mixture of constituent elemental powders.

EXAMPLE 2

A mixture of 3.45 grams of tantalum (Ta) and 1.55 grams of aluminum (Al) elemental powders, to make up $TaAl_3$, is placed in the die of Example 1. An external pressure of between 4,000–15,000 pounds is then applied over one square inch to produce a specimen resistance of 280 to 560 milliohms. Then 8 to 12 kJ energies are discharged over a period of approximately 180 us from a capacitor bank of 720 uF to the compressed powder mixture to form an intermetallic compound of Ta and Al.

EXAMPLE 3

A mixture of 4.56 grams of niobium (Nb) and 0.44 grams of Aluminum (Al) elemental powders is placed in the die of Example 1. An external pressure of between approximately 4,000–15,000 pounds is then applied over one square inch to produce a specimen resistance of 280 to 560 milliohms. Then an electrical discharge of approximately 12 kJ is discharged over a period of approximately 180 us from a capacitor bank of 720 uF to the compressed powder mixture to form an intermetallic compound of Nb and Al.

EXAMPLE 4

Similarly, the intermetallic compounds such as TiAl (m.p. 1460° C.) and $TiAl_3$ (m.p. 1340° C.) can be made from mixtures of elemental titanium and aluminum powders by the electro-discharge compaction technique.

In summary, numerous benefits result from employing the concepts of the present invention. The present invention provides a safe, efficient and effective method for fabricating relatively dense monoliths of high temperature alloys. Advantageously, the method may be performed at ambient temperatures without the need of a protective atmosphere. In addition, no pre-preparation such as the melting of the alloy materials is required. Compacts of near theoretical density may be produced in substantially any desired shape. In addition, the resulting high temperature alloy monoliths exhibit little or no grain growth and the homogeneous chemistry and fine grain structure of the products provide greatly enhanced mechanical properties.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

I claim:

1. A method of synthesizing a high temperature alloy from a mixture of elemental powders utilizing a die comprising the steps of:

placing said elemental powders of a desired compositional mixture into said die;

applying a relatively high pressure of substantially 1.0 to 15.0 ksi to said elemental powders in said die; and substantially simultaneously with the application of pressure applying an electrical discharge to said elemental powders to generate sufficient heat for alloying, said electrical discharge having a relatively high voltage of substantially 5.0 to 30.0 kV and a relatively high current density of substantially 322.5 to 6450.0 $kA/in^2$;

said pressure and electrical discharge being applied to said elemental powders for a time period of substantially 10 to 200 $\mu s$, whereby said elemental powders are rapidly alloyed together; said alloyed powders also having sufficient mass so that heat is rapidly dissipated by self quenching whereby diffusion is limited so as to allow formation of new alloys.

2. The method set forth in claim 1, wherein said current density of said electrical discharge is substantially 322.5 to 3225.0 $kA/in^2$.

3. The method set forth in claim 1, including an additional step of tailoring properties of said high temperature alloy by blending different elemental powders.

4. The method of claim 1, including a step of compacting the high temperature alloy to a density between 80 and 95% of theoretical density.

5. The method of claim 1, including the step of mixing various elemental powders together in a mixing lubricant.

6. The method of claim 1, wherein said relatively high pressure is applied to said elemental powders in said die to produce a resistance of between 280 and 560 milliohms across said elemental powders.

7. A dense monolith of high temperature alloy fabricated in accordance with the method set forth in claim 1.

* * * * *